US012635372B2

(12) United States Patent
Sim et al.

(10) Patent No.: US 12,635,372 B2
(45) Date of Patent: May 19, 2026

(54) DISPLAY DEVICE AND MULTI-PANEL DISPLAY DEVICE

(71) Applicant: LG Display Co., Ltd., Seoul (KR)

(72) Inventors: WooJin Sim, Seoul (KR); JoongHa Lee, Paju-si (KR); WonGyu Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 1034 days.

(21) Appl. No.: 17/468,294

(22) Filed: Sep. 7, 2021

(65) Prior Publication Data

US 2022/0102477 A1     Mar. 31, 2022

(30) Foreign Application Priority Data

Sep. 28, 2020     (KR) ......................... 10-2020-0125518

(51) Int. Cl.
H10K 59/18          (2023.01)

(52) U.S. Cl.
CPC .................................... H10K 59/18 (2023.02)

(58) Field of Classification Search
CPC ...... H10K 59/18; H10K 59/19; H10K 59/131; G02F 1/13336; H01L 25/0753; H01L 25/0655; H01L 33/62; H05K 1/147; H05K 1/117
See application file for complete search history.

(56) References Cited

U.S. PATENT DOCUMENTS

| | | | |
|---|---|---|---|
| 2019/0179591 A1* | 6/2019 | Kuo | H10K 59/18 |
| 2020/0051966 A1* | 2/2020 | Lee | H10K 77/10 |
| 2020/0233457 A1* | 7/2020 | Hwang | G02B 1/14 |
| 2023/0168554 A1* | 6/2023 | Ito | G09F 9/30 |
| | | | 349/46 |
| 2023/0176432 A1* | 6/2023 | Ma | G02F 1/136286 |
| | | | 257/91 |
| 2023/0207733 A1* | 6/2023 | Gong | H10K 59/131 |
| | | | 257/79 |

FOREIGN PATENT DOCUMENTS

| | | |
|---|---|---|
| CN | 111463234 A | 7/2020 |
| CN | 111665976 A | 9/2020 |

(Continued)

OTHER PUBLICATIONS

English Translation of KR20190068113 Kim et al. (Year: 2019).*

*Primary Examiner* — Eric K Ashbahian
(74) *Attorney, Agent, or Firm* — Birch, Stewart, Kolasch & Birch, LLP

(57)          ABSTRACT

A display device includes a plurality of signal lines disposed on an upper surface of a first substrate and electrically connected to a display unit, a plurality of link lines disposed below the first substrate, a plurality of polymer patterns disposed on a side surface of the first substrate and connecting each signal line and each link line to each other, and a plurality of side lines electrically connecting the plurality of signal lines and the plurality of link lines and disposed on the plurality of polymer patterns to overlap each polymer pattern. As such, the bezel area is narrow and the polymer pattern can suppress the migration of the metal component generated in the side line and improve the adhesive force of the side line. Further, the reliability of the display device is improved and a wiring line pattern with a narrow pitch can be formed.

18 Claims, 13 Drawing Sheets

(56)        References Cited

FOREIGN PATENT DOCUMENTS

| KR | 10-2008-0091893 A | 10/2008 | |
|----|-------------------|---------|--|
| KR | 10-2019-0044015 A | 4/2019 | |
| KR | 10-2019-0070038 A | 6/2019 | |
| KR | 20190068113 * | 6/2019 | .......... H10K 50/805 |
| KR | 10-2020-0048655 A | 5/2020 | |
| KR | 10-2020-0062635 A | 6/2020 | |
| KR | 10-2020-0110491 A | 9/2020 | |

* cited by examiner

DISPLAY DEVICE AND MULTI-PANEL DISPLAY DEVICE

CROSS-REFERENCE TO RELATED APPLICATIONS

This application claims priority to Korean Patent Application No. 10-2020-0125518 filed on Sep. 28, 2020, in the Korean Intellectual Property Office, the entire contents of which are expressly incorporated herein by reference into the present application.

BACKGROUND

Field

The present disclosure relates to a display device and a multi-panel display device, and more particularly, to a display device and a multi-panel display device which are capable of implementing a narrow bezel with a high reliability by delaying migration of a metal component generated in a side line.

Description of the Related Art

Generally, display devices include a display panel having a display area in which images are displayed and a non-display area defined along a periphery of the display area, a plurality of driving circuits disposed in the non-display area, and a printed circuit board (PCB) which supplies control signals to the plurality of driving circuits. A plurality of link lines which connects the display panel and the driving circuits are disposed in the non-display area.

The non-display area is blocked by a black matrix of the display panel or a case so that the images are not substantially displayed. As such, this area is generally referred to as a bezel area.

In order to increase an effective display screen size with the same area, the driving circuits and the link lines are disposed in a lower portion of the display panel corresponding to the non-display area and a side line is disposed on a side surface of the display panel to electrically connect the display panel and the driving circuits.

In the meantime, the size and the shape of the display are gradually diversified and in recent years, extra-large displays are attracting attention. In the ultra-large displays, it may be difficult to implement an ultra-large screen with one panel, so that a multi-display panel display device in which a plurality of display panels is disposed to be adjacent to each other is being used. Such a multi-panel display device can implement an ultra-large screen by disposing a plurality of display panels in a tile pattern. However, in the multi-panel display device, seams are formed between the adjacent display panels due to the bezel areas of the adjacent display panels. The seams can be visibly recognized by the user so that when one image is displayed on the entire screen, a sense of disconnection and awkwardness can be felt. Accordingly, the bezel area of each display panel needs to be minimized.

Further, a circuit integration degree of the display can be gradually increased so that the width of a wiring line and an interval between wiring lines are gradually reduced. Therefore, a migration phenomenon that a metal component which configures the wiring line is ionized to disperse therearound may occur, which may contribute to a short defect between wiring lines.

SUMMARY OF THE DISCLOSURE

Accordingly, an object to be achieved by the present disclosure is to provide a display device and a multi-panel display device which have a high reliability by suppressing a migration phenomenon caused in a side line while having a narrow bezel.

An object of the present disclosure is to provide a display device which improves an adhesion between the side line and the substrate and is capable of protecting the display device from the external impact.

Objects of the present disclosure are not limited to the above-mentioned objects, and other objects, which are not mentioned above, can be clearly understood by those skilled in the art from the following descriptions.

According to an aspect of the present disclosure, a display device includes a first substrate including a display area and a non-display area which encloses the display area, a display unit disposed on an upper surface of the first substrate, a plurality of signal lines which is disposed on the upper surface of the first substrate and is electrically connected to the display unit, a plurality of link lines disposed below the first substrate, a plurality of polymer patterns which is disposed on a side surface of the first substrate and connects each signal line and each link line to each other, and a plurality of side lines which electrically connects the plurality of signal lines and the plurality of link lines and is disposed on the plurality of polymer patterns to overlap each polymer pattern.

According to another aspect of the present disclosure, a multi-panel display device includes a plurality of display devices disposed to be adjacent to each other. Each of the plurality of display devices includes a first substrate including a display area and a non-display area which encloses the display area, a display unit disposed on an upper surface of the first substrate, a plurality of signal lines which is disposed on the upper surface of the first substrate and is electrically connected to the display unit, a plurality of link lines disposed below the first substrate, a plurality of polymer patterns which is disposed on a side surface of the first substrate and connects each signal line and each link line to each other, a plurality of side lines which electrically connects the plurality of signal lines and the plurality of link lines and is disposed on the plurality of polymer patterns to overlap each polymer pattern, and a protective layer which covers the plurality of side lines and includes a black material.

Other detailed matters of the exemplary embodiments are included in the detailed description and the drawings.

According to the present disclosure, it is possible to delay the migration phenomenon while improving the adhesion of the side line. By doing this, a mechanical physical property of the side line is improved and the reliability of the display device is improved.

Further, according to the present disclosure, a bezel area of the display device is narrow, and a fine-pitch line pattern can be implemented while maintaining a high reliability.

Further, according to the present disclosure, a limitation such as a thermal damage of the display unit due to an energy which is irradiated to harden a paste for forming wiring lines during a process of forming the side lines can be solved or addressed, so as to reduce/eliminate the failure rate and improve the display quality.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
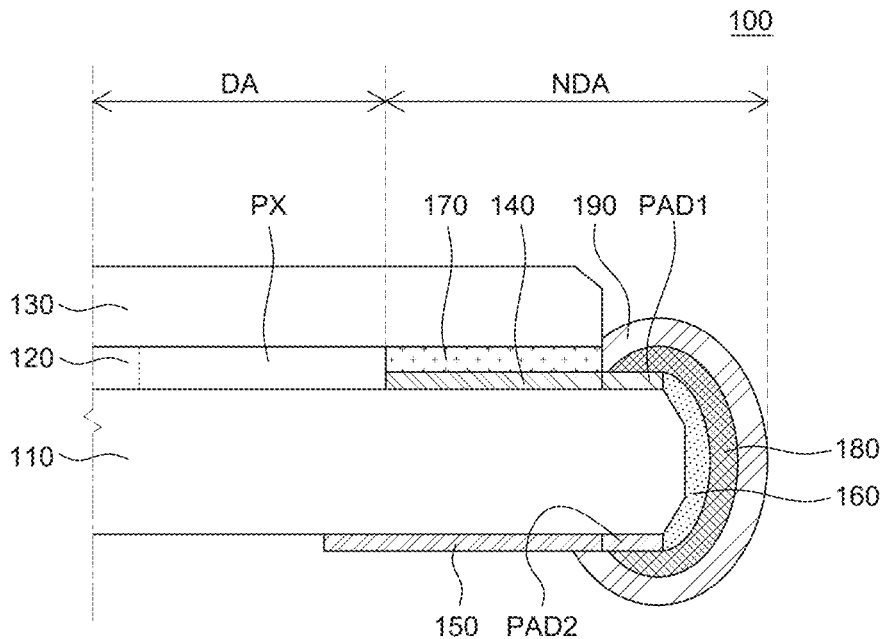
FIG. 1 is a cross-sectional view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Throughout the specification, unless otherwise specified, a particle size is a particle size at a point (D50) at which an accumulated volume is 50% in an accumulative particle size distribution.

Hereinafter, the present disclosure will be described in detail with reference to the drawings.

Figure 2:
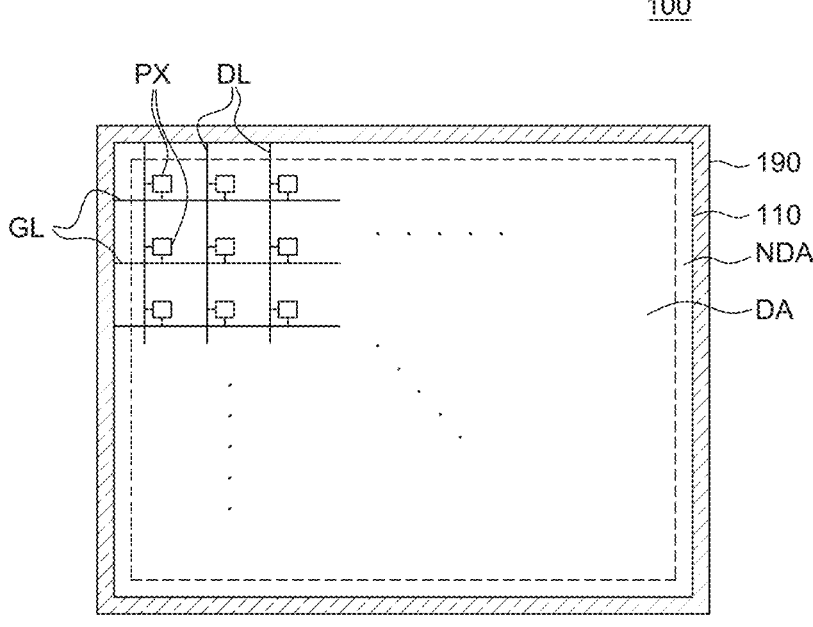
FIG. 2 is a top view of a first substrate in a display device according to an exemplary embodiment of the present disclosure.
Figure 3:
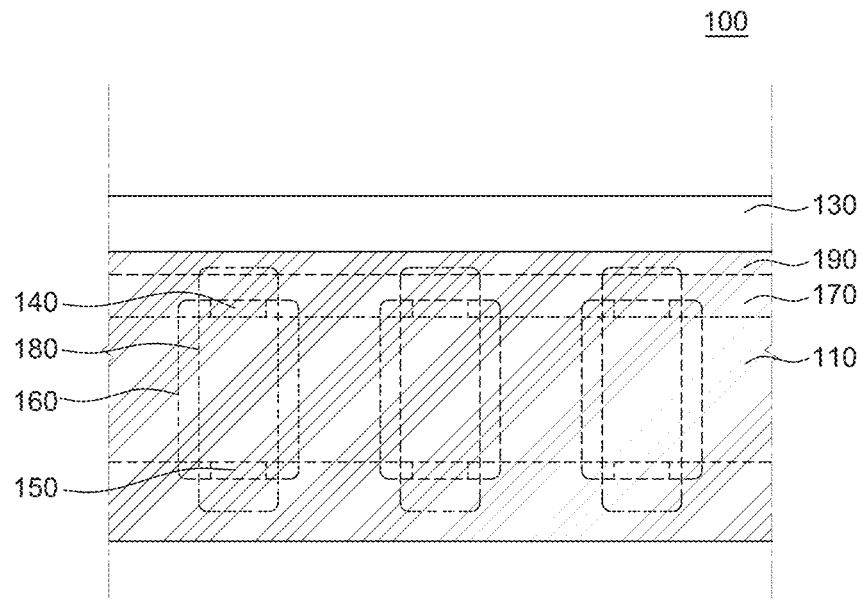
FIG. 3 is a side view of a display device according to an exemplary embodiment of the present disclosure.

FIGS. 1 to 3 are views for explaining a display device according to an exemplary embodiment of the present disclosure. All components of each display device according to all embodiments of the present disclosure are operatively configured and coupled.

More specifically, FIG. 1 is a schematic cross-sectional view of a display device according to an exemplary embodiment of the present disclosure. FIG. 2 is a schematic top view of a first substrate in a display device according to an exemplary embodiment of the present disclosure. FIG. 3 is a side view of a display device according to an exemplary embodiment of the present disclosure.

Referring to FIGS. 1 to 3, a display device 100 according to the exemplary embodiment of the present disclosure includes a first substrate 110, a display unit 120, a sealant 170, a second substrate 130, a signal line 140, a link line 150, a polymer pattern 160, a side line 180, and a protective layer 190. Hereinafter, each component will be described in more detail.

The first substrate 110 is a base substrate for supporting various components of the display unit. The first substrate 110 can be formed of an insulating material. For example, the first substrate 110 can be a glass substrate or a plastic film. The first substrate 110 can have a flexibility so as to be bendable as needed.

In the first substrate 110, a display area DA and a non-display area NDA enclosing the display area DA can be defined. The display area DA is an area where images are actually displayed in the display device 100 and in the display area DA, the display unit 120 which will be described below is disposed. The non-display area NDA is an area where images are not actually displayed so that the non-display area NDA can be defined as an edge area of the first substrate 110 which encloses the display area DA.

In the non-display area NDA, various wiring lines, such as a gate line and a data line which are connected to the thin film transistor of the display unit 120 disposed in the display area DA, can be disposed. Further, in the non-display area NDA, a driving circuit, for example, a data driving integrated circuit chip or a gate driving integrated circuit chip can be disposed and a plurality of pads can be disposed but is not limited thereto.

A plurality of pixels PX is defined in the display area DA of the first substrate 110. Each of the plurality of pixels PX is an individual unit which emits light and can include red, green, and blue pixels. If necessary, a white pixel can be included. In each of the plurality of pixels PX, the display unit 120 is formed.

The display unit 120 displays images. For example, the display unit 120 can include an organic light emitting diode and a circuit unit for driving the organic light emitting diode. Specifically, the organic light emitting diode can include an anode, at least one organic layer, and a cathode so that electrons and holes are coupled to emit light. The organic layer includes an organic light emitting layer, and additionally, can include a hole injection layer, a hole transport layer, an electron transport layer, and an electron injection layer, but is not limited thereto. For example, the circuit unit can include a plurality of thin film transistors, a capacitor, and a plurality of wiring lines to drive the organic light emitting diode.

When the display device 100 is driven in a top emission manner, the circuit unit is disposed on the first substrate 110 and the organic light emitting diode can be disposed on the circuit unit. Specifically, the thin film transistor is disposed on the first substrate 110, a planarization layer is disposed on the thin film transistor, and the anode, the plurality of organic layers including an organic light emitting layer, and the cathode are sequentially disposed on the planarization layer to configure the display unit 120.

As another example, the display unit 120 can include a liquid crystal display element and a circuit unit. Specifically, the liquid crystal display element includes a back light and a liquid crystal layer and displays images by adjusting an optical transmittance of liquid crystals.

The second substrate 130 is disposed on the display unit 120 to be opposite to the first substrate 110. The second substrate 130 is an encapsulation substrate which blocks moisture or air permeating from the outside and protects the display unit 120 from a physical impact. For example, the second substrate 130 can be a material selected from glass, a metal foil, and a plastic substrate, but is not limited thereto and can be an encapsulation layer formed by being coated with an organic material and/or an inorganic material.

The sealant 170 is disposed between the first substrate 110 and the second substrate 130 in the non-display area NDA. The sealant 170 is disposed to enclose an outer periphery of the display unit 120 and bonds the first substrate 110 and the second substrate 130. The sealant 170 blocks moisture and oxygen permeating from a side surface of the display unit 120 and can be referred to as a dam. When the encapsulation layer which is formed by being coated with the organic material and/or the inorganic material is used as the second substrate 130, the encapsulation layer itself has adhesiveness so that the first substrate 110 and the second substrate 130 can be bonded to each other. Accordingly, when the second substrate 130 does not have a plate shape but is an encapsulation layer formed by being coated with the organic material and/or the inorganic material, the sealant 170 can be omitted.

The plurality of signal lines 140 is disposed on an upper surface (also referred to as a front surface) of the first substrate 110 and the plurality of link lines 150 is disposed below the first substrate 110, e.g., on a lower surface (also referred to as a rear surface) of the first substrate 110. The plurality of signal lines 140 is electrically connected to the component of the display unit 120 to transmit a signal to the display unit 120. The plurality of link lines 150 is wiring lines which connect the plurality of signal lines 150 formed on the upper surface of the first substrate 110 and the driving circuit.

Specifically, referring to FIGS. 1 and 2 together, the plurality of signal lines 140 disposed on the upper surface of the first substrate 110 can be a plurality of gate lines GL and a plurality of data lines DL. The plurality of gate lines GL and the plurality of data lines DL are electrically connected to the thin film transistor of the display unit 120 disposed in the display area DA to transmit a gate signal and a data signal.

In the meantime, the plurality of link lines 150 disposed on the lower surface of the first substrate 110 can be a plurality of gate link lines and a plurality of data link lines. The plurality of gate link lines is wiring lines which connect the plurality of gate lines GL disposed on the upper surface of the first substrate 110 and the gate driving circuit. The plurality of data link lines is wiring lines which connect the plurality of data lines DL disposed on the upper surface of the first substrate 110 and the data driving circuit. The plurality of gate link lines and the plurality of data link lines can extend from an end of the lower surface of the first substrate 110 to a center of the lower surface of the first substrate 110.

Further, on the lower surface of the first substrate 110, a gate driving circuit is disposed to be electrically connected to the plurality of gate link lines and a data driving circuit can be disposed to be electrically connected to the plurality of data link lines. At this time, the gate driving circuit and the data driving circuit can be formed directly on the lower surface of the first substrate 110 and can be disposed on the lower surface of the first substrate 110 in a chip on film manner. As another example, the gate driving circuit and the data driving circuit can be connected to the printed circuit board. The printed circuit board can transmit various signals to the plurality of signal lines 140 and the display unit 120 formed on the first substrate 110.

Referring to FIG. 1, each of the plurality of signal lines 140 can include a first pad unit PAD1 and each of the plurality of link lines 150 can include a second pad unit PAD2. The first pad unit PAD1 can be a conductive layer extending from the plurality of signal lines 140 and the second pad unit PAD2 can be a conductive layer extending from the plurality of link lines 150.

The plurality of polymer patterns 160 is disposed on the side surface of the first substrate 110. Each polymer pattern 160 extends along the side surface of the first substrate 110 to physically connect each signal line 140 disposed on the upper surface of the first substrate 110 and each link line 150 disposed on the lower surface of the first substrate 110.

For example, one polymer pattern 160 is in contact with an end of one signal line 140 disposed on the upper surface of the first substrate 110 and an end of one link line 150 disposed on the lower surface of the first substrate 110.

Further, each polymer pattern 160 is in contact with the first pad unit PAD1 and the second pad unit PAD2. For example, each polymer pattern 160 is disposed to be in contact with the side surface of the first substrate 110 continuously from the first pad unit PAD1 of each signal line 140 to the second pad unit PAD2 of each link line 150.

If necessary, each polymer pattern 160 can be disposed to selectively cover a part of the upper surface of the first pad unit PAD1 and a part of the lower surface of the second pad unit PAD2. For example, one end of each polymer pattern 160 is in contact with the end of the first pad unit PAD1 and a part of the upper surface of the first pad unit PAD1 and the other end is in contact with the end of the second pad unit PAD2 and a part of the lower surface of the second pad unit PAD2.

The plurality of polymer patterns 160 can include a first polymer pattern and a second polymer pattern. The first polymer pattern is disposed to continuously cover an end of the gate line GL formed on the upper surface of the first substrate 110, a side surface of the first substrate 110, and an end of the gate link line formed on the lower surface of the first substrate 110. Further, the second polymer pattern is disposed to continuously cover an end of the data line DL formed on the upper surface of the first substrate 110, the side surface of the first substrate 110, and an end of the data link line formed on the lower surface of the first substrate 110.

The plurality of polymer patterns 160 can be formed of an epoxy-based resin. The epoxy-based resin has a strong resistance against the change of the stress after being hardened so that a durability is excellent, and heat resistance, chemical resistance, and abrasion resistance are also excellent.

For example, the epoxy-based resin can be one or more kinds selected from a bisphenol-based epoxy resin and a glycidyl amine-based epoxy resin but is not limited thereto. Such an epoxy-based resin has excellent mechanical properties such as heat resistance or impact resistance and includes a plurality of hydroxyl groups or glycidyl groups to bond the side line 180 onto the side surface of the first substrate 110.

For example, a storage modulus of the plurality of polymer patterns 160 can be 100 MPa to 500 MPa. In this case, it is easy to form the polymer pattern 160 so that the migration of the side line 180 can be suppressed with excellent cushioning property against the external impact.

The polymer pattern 160 can be formed by various methods, and specifically, a pad printing method is appropriate. The pad printing is performed using a silicon rubber pad having an elasticity such as polydimethyl siloxane (PDMS) so that a printability for a surface having unevenness or steps is excellent. The polymer pattern 160 is formed on a portion of the side surface of the first substrate 110 having a step so that the pad printing method can be used. When the storage modulus of the plurality of polymer patterns 160 is lower than 100 MPa, it is difficult to form the polymer pattern 160 using the pad printing method so that the printability is bad, and it is difficult to form the polymer pattern 160 with a desired thickness. In contrast, when the storage modulus of the polymer pattern 160 exceeds 500

MPa, the cushioning effect achieved by the polymer pattern 160 can be degraded and the migration suppressing effect can be insignificant.

The plurality of polymer patterns 160 can further include a getter material to block moisture or oxygen which permeates the side surface of the first substrate 110 from the outside. As the getter material, a known material used in a field of display devices can be used.

Desirably, the plurality of polymer patterns 160 does not include a black material such as carbon black. When the black material is included, the black material absorbs or conducts heat which is applied during the process of forming the side line 180. Therefore, a component such as a black bank formed of an organic material which is vulnerable to heat is partially melted to cause a bleach phenomenon in which deformation and discoloration occurs.

Figure 4A:
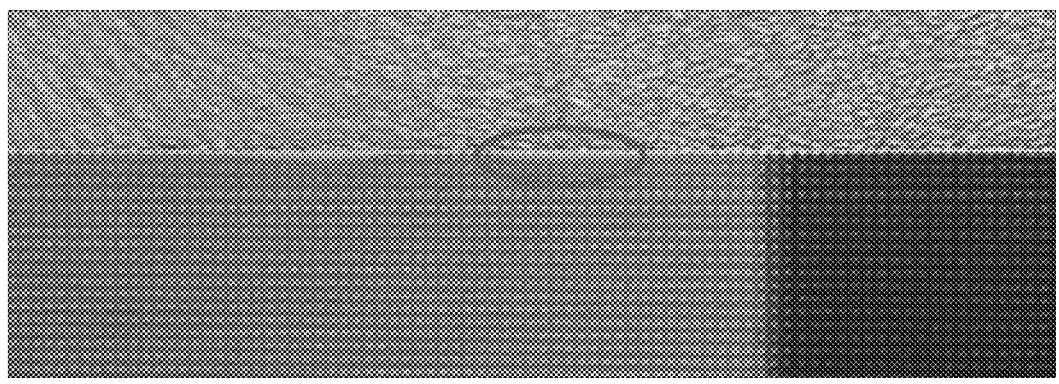
FIG. 4A is a side photograph of a display device including a polymer pattern in which a black material is not included.
Figure 4B:
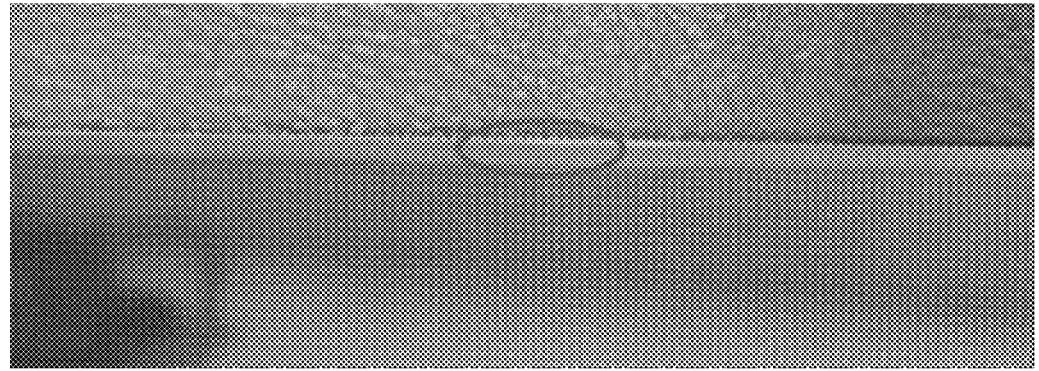
FIG. 4B is a side photograph of a display device including a polymer pattern in which a black material is included.

FIG. 4A is a side photograph of a display device including a polymer pattern in which a black material is not included and FIG. 4B is a side photograph of a display device including a polymer pattern in which a black material is included.

Referring to FIGS. 4A and 4B, it can be confirmed that in the display device of FIG. 4B in which the polymer pattern includes a black material, the bleach phenomenon is generated in an area much wider than that of the display device of FIG. 4A.

The plurality of polymer patterns 160 maintains an electrical characteristic to be high for a long time and suppresses the short between wiring lines by delaying the migration phenomenon generated in the side line 180 to contribute to improvement of the reliability, which will be described below.

The plurality of side lines 180 electrically connects the signal lines 140 disposed on the upper surface of the first substrate 110 and the link lines 150 disposed on the lower surface of the first substrate 110. The plurality of side lines 180 is patterned to electrically connect the plurality of corresponding signal lines 140 and the plurality of corresponding link lines 150 to each other. Each side line 180 is disposed on the polymer pattern 160 to overlap the polymer pattern 160. For example, one entire side line 180 is disposed to overlap a part of the corresponding polymer pattern 160. Further, each of the plurality of side lines 180 has a structure extending from the corresponding signal line 140 to the link line 150 along the polymer pattern 160. Therefore, the side line 180 is not in direct contact with the first substrate 110 and the migration generated in the side line 180 can be suppressed.

The plurality of side lines 180 is disposed to be in contact with the plurality of signal lines 140 disposed on the upper surface of the first substrate 110 and the plurality of link lines 150 disposed on the lower surface of the first substrate 110 to electrically connect the signal lines 140 and the link lines 150.

Referring to FIG. 1, the first substrate 110 protrudes outwardly from the second substrate 130. Therefore, an end of each of the plurality of signal lines 140 disposed on the upper surface of the first substrate 110, for example, an upper surface of the first pad unit PAD1 is exposed. The side line 180 is disposed to be in direct contact with the upper surface of the first pad unit PAD1 and the lower surface of the second pad unit PAD2 which are not in direct contact with the polymer pattern 160 to be exposed.

For example, the plurality of side lines 180 is disposed continuously from the upper surface of the first pad unit PAD1 of the plurality of signal lines 140 to the lower surface of the second pad unit PAD2 of the plurality of link lines 150 to be in direct contact with the first pad unit PAD1, the polymer pattern 160, and the second pad unit PAD2.

The plurality of side lines 180 can include a first side line and a second side line. The first side line electrically connects the gate line GL formed on the upper surface of the first substrate 110 and the gate link line formed on the lower surface of the first substrate 110. The second side line electrically connects the data line DL formed on the upper surface of the first substrate 110 and the data link line formed on the lower surface of the first substrate 110.

The plurality of side lines 180 includes a conductive material and a resin. For example, the plurality of side lines 180 can be formed by patterning the paste including conductive particles and a curable resin using a pad printing method and then performing a thermal treatment thereon. During the thermal treatment, the conductive particles are sintered, and the curable resin is hardened to form the side line 180 including the conductive material and the resin.

For example, the conductive particles can include one or more metals selected from silver (Ag), gold (Au), platinum (Pt), palladium (Pd), and copper (Cu). For example, the conductive particle can be silver or an alloy thereof, which is hardly oxidized and has excellent electrical characteristic.

For example, a particle size of the conductive particle can be 10 nm to 5 μm or 100 nm to 4 μm. The conductive particle can have a single particle size distribution, and if necessary, can have a multiple particle size distribution. For example, the conductive particles can include conductive particles having a particle size of 10 nm to 400 nm and conductive particles having a particle size of 1 μm to 5 μm.

For example, the curable resin provides an adhesiveness between interfaces to allow the side line 180 to be bonded onto the polymer pattern 160 without being separated. For example, the curable resin can be an epoxy-based resin. The epoxy-based resin can improve the adhesion between the interfaces and have a strong resistance against the deformation of the stress after curing, and protect the side line 180 from the physical impact. The epoxy-based resin included in the side line 180 can be the same as the epoxy-based resin included in the polymer pattern 160, but is not limited thereto.

Further, each of the plurality of side lines 180 can be formed as a single layer, and if necessary, selectively formed by a plurality of layers. At this time, when the side line 180 is formed as a plurality of layers, each layer can be formed with a paste including conductive particles having different particle sizes. For example, when each of the plurality of side lines 180 is formed as a double layer, a lower layer is formed using a paste including conductive particles having a particle size of 10 nm to 400 nm and an upper layer can be formed using a paste including conductive particles having a particle size of 1 μm to 5 μm. In this case, the electrical characteristic of the side line 180 is more excellent and the mechanical strength thereof can be improved.

The metal which configures the side line 180 can be ionized in accordance with an external environment and the ionized metal is deposited between adjacent side lines 180 while moving to the adjacent side lines 180 to cause a short defect.

In the present disclosure, each side line 180 is disposed on the corresponding polymer pattern 160 to be in direct contact therewith. Therefore, each side line 180 is not in direct contact with the first substrate 110. By doing this, a proceeding path of the migration is increased so that the migration can be suppressed and the short between wiring lines is suppressed to improve the reliability of the display device, which will be described below.

The protective layer 190 is disposed on the plurality of side lines 180. The protective layer 190 includes a black material so that the side line 180 is not visible from the outside. The plurality of side lines 180 is formed of a metal material having a glossy property such as silver (Ag), so that external light or light emitted from the display unit 120 is reflected to be recognized by the user. Therefore, the protective layer 190 is formed of an insulating material including a black material. For example, the protective layer 190 can be an insulating layer including a black material.

For example, the protective layer 190 can be formed using the pad printing method but is not limited thereto.

For example, the protective layer 190 can be disposed to enclose all the side surfaces of the first substrate 110. For example, the protective layer 190 can be formed as one layer so as to cover all the plurality of polymer patterns 160 and the plurality of side lines 180 which are patterned to connect the signal lines 140 and the link lines which correspond to each other.

As another example, the protective layer 190 can be patterned so as to correspond to the plurality of polymer patterns 160 and the plurality of side lines 180. For example, the protective layer 190 can have a structure patterned so as to overlap the plurality of polymer patterns 160 and the plurality of side lines 180 which are patterned to connect the signal lines 140 and the link lines which correspond to each other.

The patterned protective layer 190 can include a first protective pattern and a second protective pattern. The first protective pattern covers the polymer pattern 160 and the side line 180 which connect the gate line GL formed on the upper surface of the first substrate 110 and the gate link line formed on the lower surface of the first substrate 110. The second protective pattern covers the polymer pattern 160 and the side line 180 which connect the data line DL formed on the upper surface of the first substrate 110 and the data link line formed on the lower surface of the first substrate 110. Widths of the first protective pattern and the second protective pattern can be larger than the width of the polymer pattern 160 so as to cover all the corresponding polymer pattern 160 and side line 180.

Figure 5:
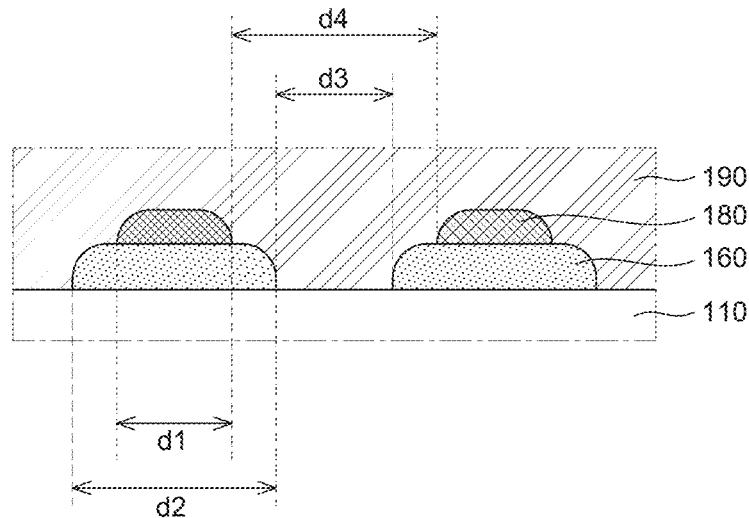
FIG. 5 is a cross-sectional view for explaining a placement structure of a polymer pattern, a side line, and a protective layer in a display device according to an exemplary embodiment of the present disclosure.

Hereinafter, a placement structure of the polymer pattern, the side line, and the protective layer and an effect thereof will be described in more detail with reference to FIG. 5. FIG. 5 is still another cross-sectional view for specifically explaining a placement structure of a polymer pattern, a side line, and a protective layer, in a display device according to an exemplary embodiment of the present disclosure. In FIG. 5, for the convenience of clarity and description, components other than the first substrate, the polymer pattern, the side line, and the protective layer are not illustrated.

Referring to FIG. 5, the polymer pattern 160 is disposed on the first substrate 110 and the side line 180 is disposed on the polymer pattern 160. As described above, the polymer pattern 160 is disposed between the first substrate 110 and the side line 180 to suppress the migration generated in the side line 180.

Specifically, the metal which is a conductive material which configures the wiring line can be ionized by moisture or oxygen entering from the outside and metal ions are easily eluted from the wiring line and diffuse to adjacent wiring lines. The metal ions diffusing as described above are deposited on a surface of an adjacent wiring line and grow along the substrate to have a dendrite shape to cause the shorts between wiring lines. Such a short failure can be more frequently generated in a fine-pitch wiring line structure having a narrow interval between the side lines of 100 μm or smaller.

In the present disclosure, the side line 180 is disposed on the polymer pattern 160 and a width d2 of the polymer pattern 160 is larger than a width d1 of the side line 180. Therefore, the metal ions generated from the side line 180 are not in contact with the first substrate 110 so that the migration can be suppressed. According to the related art, as the side line is formed to be in direct contact with the substrate, migration proceeds in a straight line along the surface of the substrate between adjacent side lines so that the shorts between side lines are easily generated. In contrast, according to the present disclosure, the side line 180 is disposed on the polymer pattern 160 to be in contact therewith so that the side line 180 is not in direct contact with the first substrate 110. Accordingly, even though the migration is generated, unlike the related art, the migration proceeds along the first substrate 110 via the surface of the polymer pattern 160 which is not in contact with the side line 180 to be exposed so that the proceeding path of the migration is increased. Therefore, the shorts which may be generated between adjacent side lines can be suppressed.

For example, the width d2 of the polymer pattern 160 can be 40 μm to 100 μm and the width d1 of the side line 180 can be 20 μm to 80 μm. Within this range, the proceeding path of the migration is increased while maintaining the electrical characteristic of the side line 180 to be high so that the short defect can be minimized.

According to the present disclosure, the proceeding path of the migration can be increased without increasing the interval between the side lines 180. Therefore, a short defect can be minimized while maintaining the narrow interval of the side lines 180 to be 100 μm or smaller to implement a highly integrated circuit with an improved reliability.

For example, the interval d3 between the adjacent polymer pattern 160 can be 10 μm to 60 μm or 15 μm to 40 μm and the interval d4 between the adjacent side lines 180 can be 20 μm to 100 μm or 30 μm to 80 μm. Within this range, the migration is suppressed without increasing the interval of the side lines 180 to delay or minimize a short defect.

Referring to FIGS. 1 and 5 together, the protective layer 190 is disposed to cover the polymer pattern 160 and the side line 180 formed on the first substrate 110. For example, the side line 180 is enclosed by the polymer pattern 160 and the protective layer 190 so as not to be exposed. Therefore, each side line 180 is formed to have a tunnel shape which connects the signal lines 140 and the link lines 150. As described above, the side line 180 is completely covered by the polymer pattern 160 and the protective layer 190 so that the migration generated in the side line 180 can be further suppressed and the short defect thereby can be minimized. By doing this, the reliability of the display device can be significantly improved.

Figure 6:
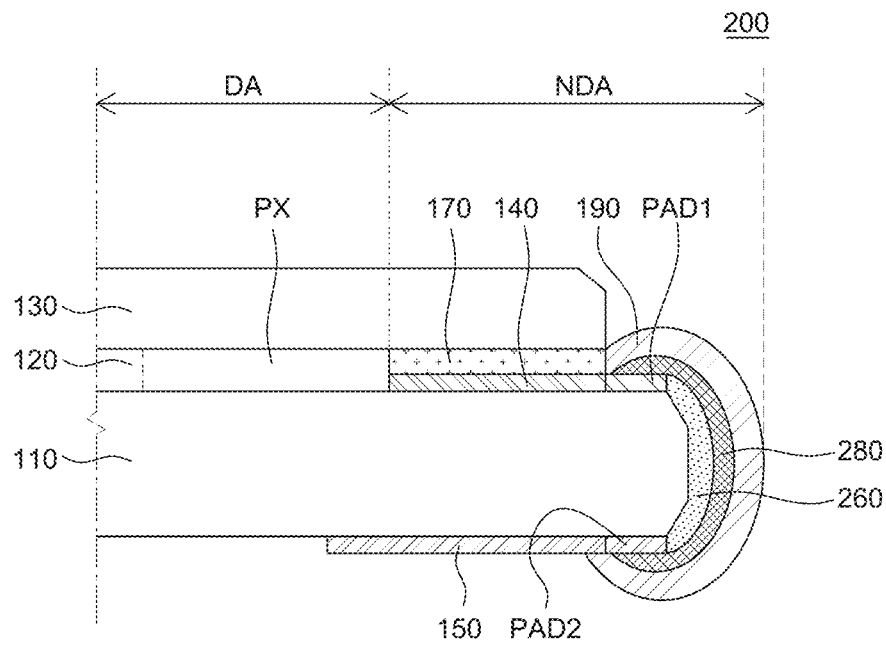
FIG. 6 is a cross-sectional view of a display device according to another exemplary embodiment of the present disclosure.
Figure 7:
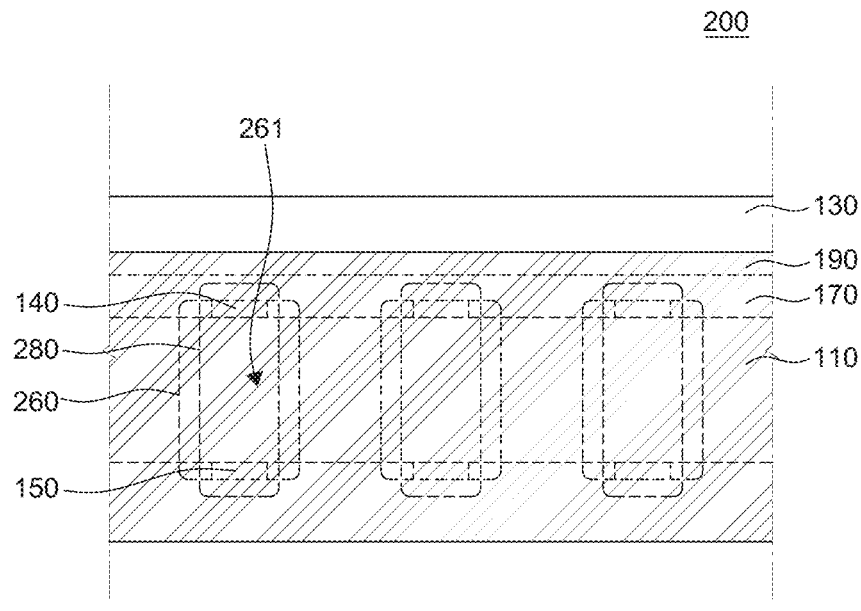
FIG. 7 is a side view of a display device according to another exemplary embodiment of the present disclosure.
Figure 8:
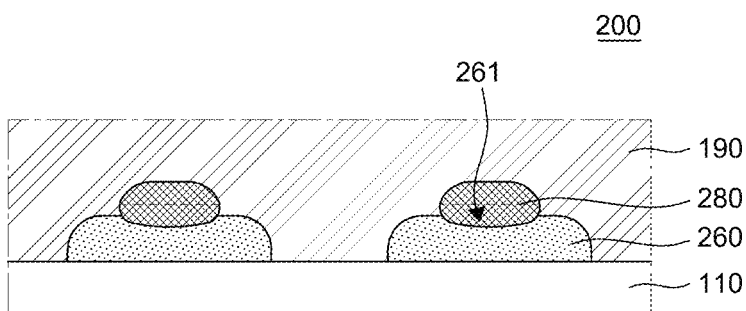
FIG. 8 is a cross-sectional view for specifically explaining a placement structure of a polymer pattern, a side line, and a protective layer in a display device according to another exemplary embodiment of the present disclosure.

FIGS. 6 to 8 are views for explaining a display device 200 according to another exemplary embodiment of the present disclosure. Particularly, FIG. 6 is a cross-sectional view of a display apparatus according to another exemplary embodiment of the present disclosure, and FIG. 7 is a side view of a display device according to another exemplary embodiment of the present disclosure. FIG. 8 is a cross-sectional view for specifically explaining a placement structure of a polymer pattern, a side line, and a protective layer in a display device according to another exemplary embodiment of the present disclosure. In FIG. 8, for the convenience of description, components other than the first substrate, the polymer pattern, the side line, and the protective layer are not illustrated.

As compared with the display device illustrated in FIGS. 1 to 3 and 5, other components of the exemplary embodiment illustrated in FIGS. 6 to 8 are substantially the same except that a concave portion is formed on the polymer pattern and a placement structure of the side line is different, so that a redundant description will be omitted or may be briefly provided.

Referring to FIGS. 6 to 8 together, each of a plurality of polymer patterns 260 includes a concave portion 261.

Referring to FIGS. 7 and 8, the concave portion 261 is formed such that a part of the surface of the polymer pattern 260 which is in contact with the side line 280 is concavely dented. Therefore, a thickness of an area of the polymer pattern 260 in which the concave portion 261 is formed is smaller than a thickness of an area in which the concave portion is not formed.

The concave portion 261 is formed to be elongated from one end of the polymer pattern 260 which is in contact with an end of the signal line 140 to the other end of the polymer pattern 260 which is in contact with an end of the link line 150.

The concave portion 261 of the polymer pattern 260 encloses side surfaces of the side line 280. As described above, when the area of the side line 280 which is in contact with the polymer pattern 260 is increased, the influence on the moisture which causes the migration is reduced and the migration is delayed so that the reliability of the display device can be further improved.

As described above, the polymer pattern 260 can be formed by performing the pad printing process on the epoxy-based resin. For example, a pad printing process of the polymer pattern 260 can include a step of applying an epoxy-based resin on a metal plate in which an engraved pattern unit is formed, a step of coating the patterned epoxy-based resin on a silicon pad such as PDMS, a step of printing the patterned epoxy-based resin on a side surface of the first substrate, and a step of hardening the resin. However, this is merely illustrative so that the pad printing process is not limited to the above-described steps.

A rigidity of the polymer pattern 260 varies depending on a degree of hardening the epoxy-based resin. The lower the hardening degree of the epoxy-based resin, relatively, the lower the storage modulus of the polymer pattern 260 to be formed so that the rigidity is low. When the rigidity of the polymer pattern 260 is low, during the process of forming the side line 280 on the polymer pattern 260 using the pad printing method, the polymer pattern 260 is pressed to form the concave portion 261. Therefore, the lower the storage modulus of the polymer pattern 260, the higher the ductility and the deeper the concave portion 261 to be formed.

Ad described above, a storage modulus of the polymer pattern 260 can be 100 MPa to 500 MPa. When the storage modulus of the polymer pattern 260a is lower than 100 MPa, the spreadability of the polymer pattern 260a is increased so that the pattern shape is not maintained. Further, it can be difficult to form the polymer pattern 260a with a desired thickness. Further, the ductility is significantly increased so that when the pad printing is performed on the side line 280a above the polymer pattern 260a, the printability is not good.

In contrast, when the storage modulus of the polymer pattern 260b is 500 MPa or higher, the rigidity of the polymer pattern 260b is too high so that the impact cushioning characteristic can be degraded. Further, when the rigidity of the polymer pattern 260b is too high, a portion which is in contact with the side line 280b is not pressed, but is maintained to be flat. As described above, when the paste is printed on the polymer pattern 280b having a high rigidity using the pad printing method, a side line 280b which has a width larger than a target width and a thickness smaller than a target thickness can be formed. In this case, the increasing effect of the proceeding path of the migration by the polymer pattern 260b can be slightly lowered.

Therefore, the storage modulus of the polymer pattern 260 can be 100 MPa to 500 MPa but is not limited thereto. The storage modulus of the polymer pattern 260 can vary depending on a printing method, a composition of a composite for forming the polymer pattern 260, and a composition of the paste for forming the side line 280.

Figure 9:
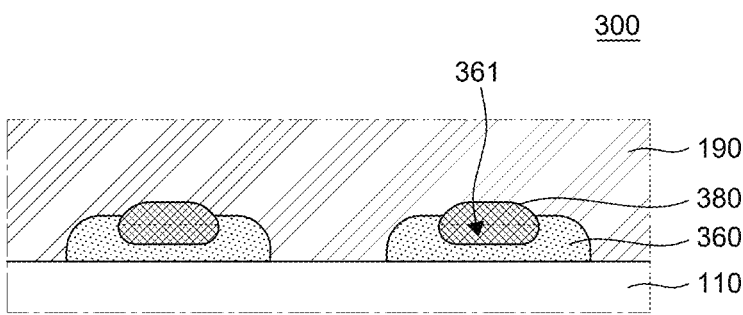
FIG. 9 is a cross-sectional view for specifically explaining a placement structure of a polymer pattern, a side line, and a protective layer in a display device according to still another exemplary embodiment of the present disclosure.

FIG. 9 is a view for explaining a display device 300 according to still another exemplary embodiment of the present disclosure. FIG. 9 is a cross-sectional view for specifically explaining a placement structure of a polymer pattern, a side line, and a protective layer in a display device according to still another exemplary embodiment of the present disclosure. In FIG. 9, for the convenience of description, components other than the first substrate, the polymer pattern, the side line, and the protective layer are not illustrated. As compared with the display device illustrated in FIGS. 6 to 8, the components of the exemplary embodiment illustrated in FIG. 9 is substantially the same except for a depth of the concave portion and the placement structure of the polymer pattern and the side line, so that a redundant description will be omitted or may be briefly provided.

Referring to FIG. 9, in the display device according to still another exemplary embodiment of the present disclosure, a depth of a concave portion 361 formed on the polymer pattern 360 is deeper than that of the exemplary embodiment illustrated in FIGS. 6 and 7. As described above, the depth of the concave portion is affected by the hardening degree of the polymer pattern and a storage modulus thereby. For example, the hardening degree and the storage modulus of the polymer pattern 360 are lower than those of the exemplary embodiment illustrated in FIGS. 6 to 7 so that a deeper concave portion 361 can be formed.

The concave portion 361 of the polymer pattern 360 encloses not only side surfaces of the side line 380, but also a part of an upper surface of the side line 180. For example, the side surfaces and the part of the upper surface of the side line 380 are in contact with the polymer pattern 360 and a part of the upper surface of the side line 180 which is not in contact with the polymer pattern 360 is in contact with the protective layer 190. Therefore, the influence of the moisture which causes the migration and accelerates the proceeding of the migration is reduced and the generation and proceeding of the migration can be further delayed.

Figure 10:
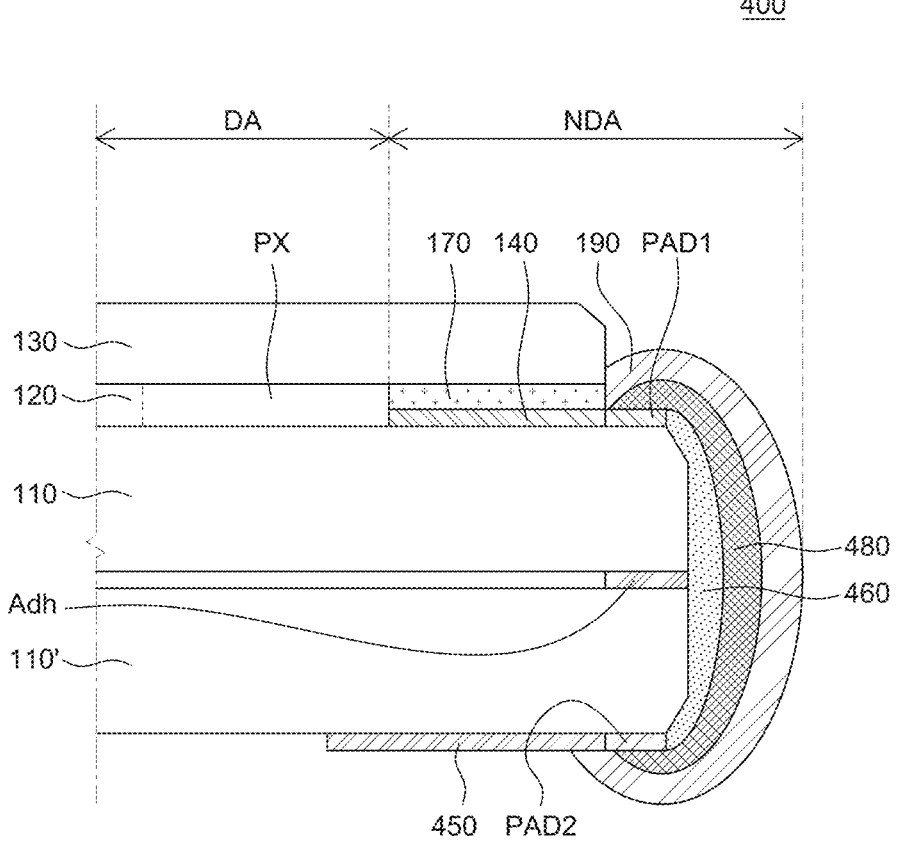
FIG. 10 is a cross-sectional view of a display device according to still another exemplary embodiment of the present disclosure.

FIG. 10 is a cross-sectional view of a display device according to still another exemplary embodiment of the present disclosure. As compared with the display device illustrated in FIGS. 1 to 3, an exemplary embodiment illustrated in FIG. 10 further includes a third substrate on a lower surface of the first substrate and has different structures of a plurality of link lines, a plurality of polymer patterns, a plurality of side lines, and a protective layer. However, the other components are substantially the same so that a redundant description will be omitted or may be briefly provided.

Referring to FIG. 10, a third substrate 110' is disposed on a lower surface of the first substrate 110. The third substrate 110' is an auxiliary substrate which supports components in a lower portion of the display device 400. The third substrate 110' can be formed of an insulating material. For example, the third substrate 110' can be a glass substrate or a plastic film. The third substrate 110' can be formed of the same material as the first substrate 110.

An adhesive layer Adh is disposed between the first substrate 110 and the third substrate 110'. The adhesive layer Adh bonds the first substrate 110 and the third substrate 110'. The adhesive layer Adh can be disposed on the first substrate 110 or the third substrate 110' so as to correspond to the non-display area NDA of the first substrate 110. However, it is not limited thereto so that the adhesive layer Adh can be disposed in the entire area between the first substrate 110 or the third substrate 110'.

In the case of the display device 100 illustrated in FIGS. 1 to 3, the display unit 120 and the plurality of signal lines 140 are disposed on an upper surface of the first substrate 110 and the link line 150 and the driving circuit are disposed on a lower surface of the first substrate 110. When components are disposed on both surfaces of one substrate as described above, during the process of disposing some components on one surface and then disposing the other components on the other surface, it may be difficult to secure the stability of the process.

Accordingly, the display device 400 can be easily manufactured by a process of bonding the first substrate 110 and the third substrate 110' after disposing the display unit 120 and the signal line 140 on the first substrate 110 and disposing the link line 450 and the driving circuit on the third substrate 110'. Further, it is advantageous for the stability of the process and the reliability of the product.

The plurality of link lines 450 is formed belong the third substrate 110', e.g., on the lower surface of the third substrate 110'. Specifically, the plurality of gate link lines and the plurality of data link lines can be formed on the lower surface of the third substrate 110'. Further, on the lower surface of the third substrate 110', a gate driving circuit is disposed to be electrically connected to the plurality of gate link lines and a data driving circuit can be disposed to be electrically connected to the plurality of data link lines.

The plurality of polymer patterns 460 is disposed on the side surfaces of the first substrate 110 and the third substrate 110'. The plurality of polymer patterns 460 physically connects the signal lines 140 and the link line 450 which correspond to each other. For example, each polymer pattern 460 is disposed to cover the side surfaces of the first substrate 110 and the third substrates 110' continuously from an end of each signal line 140 to an end of each link line 450. Therefore, the plurality of polymer patterns 460 is in direct contact with ends of the plurality of signal lines disposed on the upper surface of the first substrate 110, side surfaces of the first substrate 110 and the third substrate 110', and ends of the plurality of link lines 450 disposed on the lower surface of the third substrate 110'.

The plurality of side lines 480 electrically connects the signal lines 140 and the link lines 450. Each of the plurality of side lines 480 is disposed on the corresponding polymer pattern 460 to be in contact therewith. Each side line 480 is continuously disposed from the upper surface of the signal line 140 which is not in contact with the polymer pattern 460 to be exposed to the lower surface of the link line 450 disposed on the lower surface of the third substrate 110'. By doing this, each side line 480 is in direct contact with the upper surface of each signal line 140, the polymer pattern 460, and the lower surface of each link line 450.

The protective layer 490 is disposed on the plurality of side lines 480. For example, the protective layer 490 can be disposed to enclose all the side surfaces of the first substrate 110 and the third substrate 110'. For example, the protective layer 490 can be formed as one layer so as to cover all the plurality of polymer patterns 460 and the plurality of side lines 480 which are patterned to connect the signal lines 140 and the link lines 450 which correspond to each other. However, it is not limited thereto and the protective layer 490 can be selectively patterned so as to correspond to the plurality of polymer patterns 460 and the plurality of side patterns 480.

In the display device according to various exemplary embodiments of the present disclosure, the side line is disposed on the polymer pattern to minimize the migration generated in the side line and a short caused thereby and minimize the bezel area, to implement a narrow bezel. Such a display device is disposed in a tile pattern to be implemented as one multi-panel display device. Hereinafter, a multi-panel display device according to an exemplary embodiment of the present disclosure will be described with reference to FIGS. 11 to 13.

Figure 11:
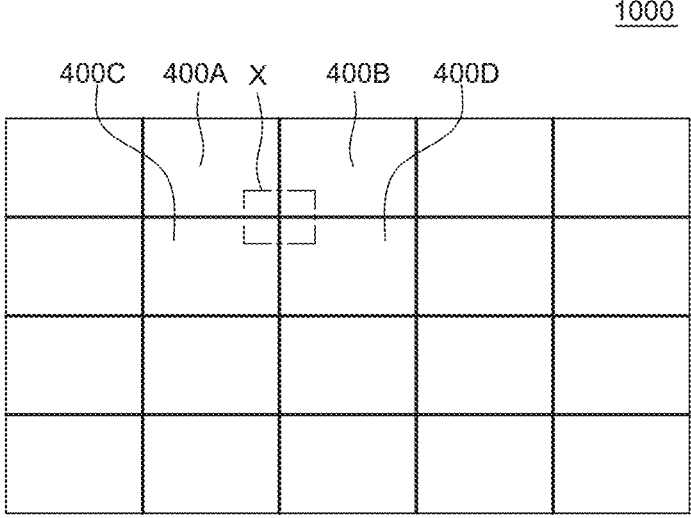
FIG. 11 is a plan view of a multi-panel display device according to an exemplary embodiment of the present disclosure.
Figure 12:
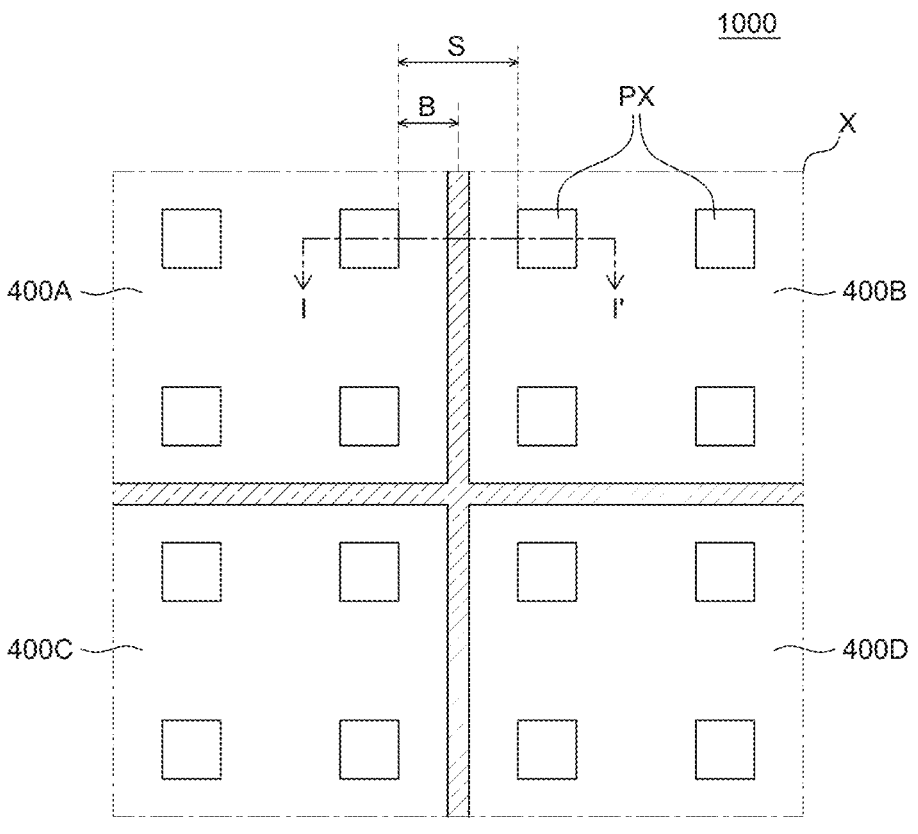
FIG. 12 is an enlarged plan view of a region X of FIG. 11.
Figure 13:
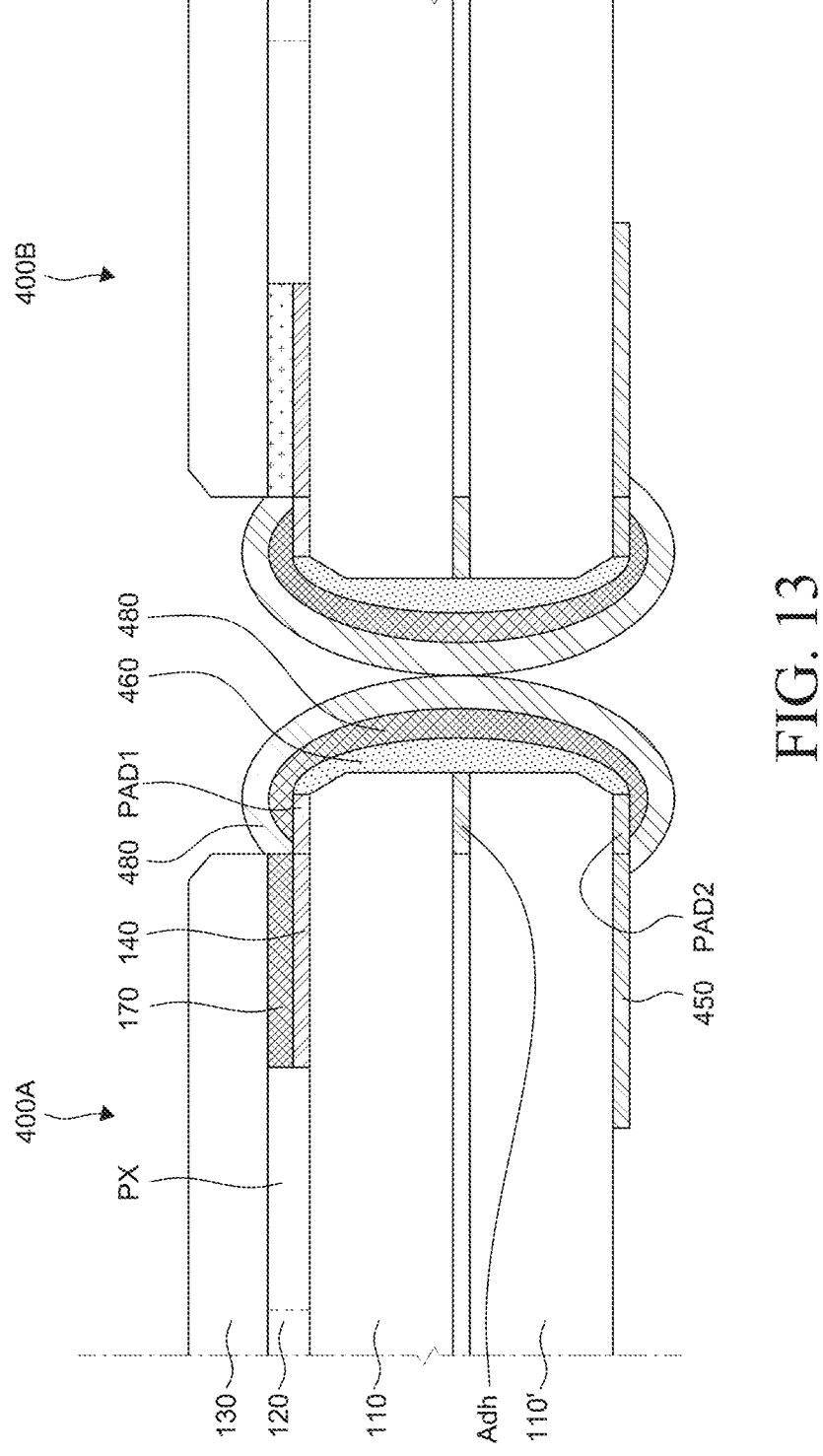
FIG. 13 is a cross-sectional view taken along the line I-I' of FIG. 12.

FIG. 11 is a plan view of a multi-panel display device according to an exemplary embodiment of the present disclosure, FIG. 12 is an enlarged plan view of a region X of FIG. 11, and FIG. 13 is a cross-sectional view taken along the line I-I' of FIG. 12.

Referring to FIG. 11, a multi-panel display device 1000 according to an exemplary embodiment of the present disclosure includes a plurality of display devices. The plurality of display devices is disposed in an m×n tile pattern to be implemented as one multi-panel display device 1000. For the convenience of description, in FIG. 11, even though it is illustrated that twenty display devices are disposed in a 5×4 tile pattern, the present disclosure is not limited thereto so that any appropriate number of display devices can be disposed as needed or desired.

Referring to FIG. 12 enlarging a region X of FIG. 11, the plurality of display devices can be disposed to be in contact with each other vertically or horizontally. For example, the plurality of display devices includes a first display device 400A, a second display device 400B, a third display device 400C, and a fourth display device 400D. The first display device 400A and the second display device 400B are disposed to be in contact with each other horizontally and the first display device 400A and the third display device 400C are disposed to be in contact with each other vertically.

FIG. 13 is a cross-sectional view taken along the line I-I' of FIG. 12.

Referring to FIG. 13, in the multi-panel display device 1000 according to the exemplary embodiment of the present disclosure, the first display device 400A and the second display device 400B are disposed to be in contact with each other horizontally. The first and second display devices 400A and 400B are substantially the same as the display device 400 illustrated in FIG. 9 so that a redundant description will be omitted, but the first and second display devices 400A and 400B are not limited to the embodiment illustrated in FIG. 9.

The first display device 400A and the second display device 400B include a plurality of polymer patterns 460 and a plurality of side lines 480.

The multi-panel display device includes a plurality of display devices so that as the luminance and a circuit integration degree are increased, the power consumption is significant, and the short failure may be generated due to a narrow interval between the wiring lines. However, in the multi-panel display device 1000 according to the present disclosure, the side line 480 is disposed on the polymer pattern 460 to overlap with each other so that the migration generated in the side line 480 is suppressed and the progress thereof can be delayed. By doing this, the electrical characteristic of the side line 480 is improved to improve the power efficiency and the migration is suppressed while maintaining the interval between the side lines 480 to be small to improve the reliability.

Further, since the bezel area B is not significantly increased, one image can be displayed on the multi-panel display device 1000 without causing a sense of disconnection and awkwardness due to the seam S. Further, the high quality multi-panel display device 1000 with improved power efficiency and improved reliability is provided.

Hereinafter, the effects of the present disclosure will be described in more detail with reference to Embodiments. However, the following Embodiments are set forth to illustrate the present disclosure, but the scope of the disclosure is not limited thereto by the following Embodiment.

Embodiment 1

A composition containing a bisphenol A epoxy resin was patterned on an ITO (500 Å) substrate by a pad printing method. The epoxy resin pattern was hardened to form a plurality of polymer patterns. Next, a silver paste containing 80 weight % of silver nano particles and 20 weight % of an epoxy-based curable resin was prepared. The silver paste was patterned on each polymer pattern by the pad printing method. Next, the patterned silver paste was thermally treated to form a silver wiring line. Next, a protective layer composition containing a black material and an epoxy-based resin was prepared. The protective layer composition was applied and hardened to cover the plurality of polymer patterns and the silver wiring line to produce a specimen having the same structure as illustrated in FIG. 8 (a width of a polymer pattern was 60 µm, an interval between polymer patterns was 20 µm, a width of a silver wiring line was 50 µm, and an interval of wiring lines was 30 µm).

Embodiment 2

In Embodiment 2, the formation of the protective layer was omitted, and the polymer pattern and the silver wiring line were formed on the substrate by the same method as Embodiment 1.

Comparative Embodiment 1

In Comparative Embodiment 1, the formation of the polymer pattern and the protective layer was omitted, and the silver wiring line was directly formed on the substrate by the same method as Embodiment 1.

Comparative Embodiment 2

In Comparative Embodiment 2, the formation of the polymer pattern was omitted, and the silver wiring line was directly formed on the substrate by the same method as Embodiment 1 and the protective layer was formed on the silver wiring line.

Experimental Embodiment

A silver migration delaying effect, the reliability, the adhesive force, and the surface hardness of the wiring line of Embodiments and Comparative Embodiment were measured.

1. Water Drop Acceleration Test

In order to find out the silver migration delay effect, the water drop test was performed. In the water drop test, distilled water was dropped between wiring lines and a voltage of 1 V was applied to the wiring line to induce silver migration and measure a time when the short occurred between the wiring lines. Each specimen was measured three times and the result was described in Table 1 with an average value.

2. Reliability Test

In a chamber having a high temperature (60° C.) and a high humidity (a relative humidity of 90%), a time when the short occurred due to the migration was measured while applying a voltage of 30 V to the specimen. Four specimens for each Embodiments and Comparative Embodiments were manufactured and then the test was performed on each specimen. The result thereof was filled in the following Table 1.

3. Adhesive Force

In order to check the adhesive force of the specimen, a cross-cut separation test (YOSHIMITSU YCC-230/1) was performed. The adhesive force was evaluated according to a method specified in ASTM D3002 and D3359 and the result thereof was filled in the following Table 1. (0B: Separation was generated in most area, 1B: separated area was 35% to 65%, 2B: separated area was 15% to 35%, 3B: separated area was 5% to 15%, 4B: separated area was approximately 5%, 5B: separation was not generated)

4. Surface Hardness

A surface of specimen was scratched by a pencil while applying a load of 500 g to a specimen and then a scratch of the surface was measured with the naked eye. The result thereof was filled in the following Table 1.

TABLE 1

| Classification | | Embodiment 1 | Embodiment 2 | Comparative Embodiment 1 | Comparative Embodiment 2 |
|---|---|---|---|---|---|
| Water drop acceleration test | | 30.3 seconds | 26 seconds | 18.3 seconds | 19.7 seconds |
| Reliability test (60° C./ 90% RH) | Sample 1 | 1024 hrs | 900 hrs | 660 hrs | 700 hrs |
| | Sample 2 | 1072 hrs | 900 hrs | 660 hrs | 712 hrs |
| | Sample 3 | 1072 hrs | 928 hrs | 660 hrs | 736 hrs |
| | Sample 4 | 1100 hrs | 952 hrs | shorted | 736 hrs |
| Adhesive force | | 5B | 5B | 4B | 4B |
| Surface hardness | | 4H | 2H | 2H | 4H |

Referring to Table 1, it can be confirmed that in the silver wiring line according to Embodiment 1, it took the longest time to generate a short due to the migration in the water drop acceleration test and it took the longest time to generate a short for all four samples in the reliability test. It can be further confirmed that the wiring line according to Embodiment 1 had the highest adhesive force and the highest surface hardness.

In Embodiment 2, it can be confirmed that the wiring line was formed on the polymer pattern so that the adhesive force was the same as Embodiment 1, but due to the absence of the protective layer, the migration delay effect was worse than that of Embodiment 1, but better than that of Comparative Embodiments 1 and 2.

In Comparative Embodiment 1, the silver wiring line was directly formed on the substrate so that the proceeding path of the migration was the shortest and due to the absence of the protective layer, the silver wiring line was fully exposed so that the migration can be accelerated. Therefore, the short was generated in the shortest time and the reliability test for some samples was not available due to disconnection. Further, it can be confirmed that the adhesive force of the wiring line was worse than that of Embodiment 1 and the mechanical strength was worse than that of Embodiment 1.

Further, in Comparative Embodiment 2, it can be confirmed that the migration delay effect is slightly improved as compared with Comparative Embodiment 1 but is worse than that of Embodiments and the adhesive force was degraded.

In summary of the experimental results, it can be confirmed that when the wiring line is formed on the polymer pattern, the proceeding path of the migration is increased to delay the migration, which suppresses the short to improve the reliability of the wiring line. It can be further confirmed that the polymer pattern improves the adhesive force between the substrate and the wiring line to provide excellent adhesive force. Furthermore, it can be confirmed that the polymer pattern provides a cushioning effect against the external impact to improve the mechanical strength.

Further, when the results of Embodiments 1 and 2 are compared, it can be confirmed that as in Embodiment 1, when the wiring line is enclosed by the polymer pattern and the protective layer to form a tunnel structure, it is further effective to suppress the generation and progress of the migration.

For example, according to the present disclosure, it can be confirmed that the reliability of the wiring line is improved while maintaining a narrow interval between wiring lines so that it is advantageous to implement the narrow bezel and circuit integration.

The exemplary embodiments of the present disclosure can also be described as follows:

According to an aspect of the present disclosure, a display device comprises a first substrate including a display area and a non-display area which encloses the display area, a display unit disposed on an upper surface of the first substrate, a plurality of signal lines which is disposed on the upper surface of the first substrate and is electrically connected to the display unit, a plurality of link lines disposed below the first substrate, a plurality of polymer patterns which is disposed on a side surface of the first substrate and connects each signal line and each link line to each other, and a plurality of side lines which electrically connects the plurality of signal lines and the plurality of link lines and is disposed on the plurality of polymer patterns to overlap each polymer pattern.

Each polymer pattern can be disposed to be in direct contact with an end of each signal line and an end of each link line and can be in contact with a side surface of the first substrate continuously from the end of the signal line to the end of the link line.

The plurality of polymer patterns can include an epoxy-based resin.

A width of each polymer pattern can be 40 μm to 100 μm and an interval between the adjacent polymer patterns can be 10 μm to 60 μm.

A storage modulus of the plurality of polymer patterns can be 100 MPa to 500 MPa.

Each polymer pattern can include a concave portion which is formed such that at least a part of the surface of the polymer pattern which is in contact with the side line is concavely dented and the concave portion can extend from one end of the polymer pattern which is in contact with the end of the signal line to the other end of the polymer pattern which is in contact with the end of the link line.

The concave portion can enclose a side surface of the side line.

The concave portion can enclose a side surface and a part of an upper surface of the side line.

The plurality of side lines can be in direct contact with an upper surface of the plurality of signal lines and a lower surface of the plurality of link lines.

The plurality of side lines can include a conductive material and resin.

A width of each side line can be 20 μm to 80 μm and an interval between the adjacent side lines can be 20 μm to 100 μm.

The display device can further comprise a protective layer which covers the plurality of side lines and includes a black material.

The protective layer can be formed as one layer to enclose all side surfaces of the first substrate and cover all the plurality of side lines or can be patterned so as to correspond to each of the plurality of side lines.

Each side line can be formed to have a tunnel shape to connect the signal lines and the link lines between the polymer patterns and the protective layer.

The display device can further comprise a third substrate disposed below the first substrate, wherein the plurality of link lines can be disposed below the third substrate, each polymer pattern can be disposed to be in contact with the side surfaces of the first substrate and the third substrate continuously from an end of each signal line to an end of each link line and each side line can be disposed on the polymer pattern to connect each signal line and each link line.

According to another aspect of the present disclosure, a multi-panel display device can comprise a plurality of display devices disposed to be adjacent to each other, wherein each of the plurality of display devices includes a first substrate including a display area and a non-display area which encloses the display area, a display unit disposed on an upper surface of the first substrate, a plurality of signal lines which is disposed on the upper surface of the first substrate and is electrically connected to the display unit, a plurality of link lines disposed below the first substrate, a plurality of polymer patterns which is disposed on a side surface of the first substrate and connects each signal line and each link line to each other, a plurality of side lines which electrically connects the plurality of signal lines and the plurality of link lines and is disposed on the plurality of polymer patterns to overlap each polymer pattern, and a protective layer which covers the plurality of side lines and includes a black material.

Each side line can be formed to have a tunnel shape to connect the signal lines and the link lines between the polymer patterns and the protective layer.

Each polymer pattern can be disposed to be in direct contact with an end of each signal line and an end of each link line and can be in contact with a side surface of the first substrate to be continuous from the end of the signal line to the end of the link line.

The plurality of polymer patterns can include an epoxy-based resin, and the plurality of side lines can include a conductive material and a resin.

Each polymer pattern can include a concave portion which is formed such that at least a part of the surface of the polymer pattern which is in contact with the side line is concavely dented and the concave portion can extend from one end of the polymer pattern which is in contact with the end of the signal line to the other end of the polymer pattern which is in contact with the end of the link line.

The concave portion can enclose a side surface of the side line or the side surface and a part of an upper surface of the side line.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a first substrate including a display area and a non-display area which encloses the display area;
a display unit disposed on an upper surface of the first substrate;
a plurality of signal lines disposed on the upper surface of the first substrate, and electrically connected to the display unit;
a plurality of link lines disposed below the first substrate;
a plurality of polymer patterns disposed on a side surface of the first substrate, directly contacting each signal line and one link line, and continuously connecting each signal line and one link line to each other; and
a plurality of side lines electrically connecting and directly contacting the plurality of signal lines and the plurality of link lines, and disposed on the plurality of polymer patterns to overlap and directly contact each polymer pattern,
wherein each polymer pattern includes a concave portion which is formed so that at least a part of a surface of the each polymer pattern which is in contact with a side line of the plurality of side lines is concavely dented,
wherein each of the plurality of side lines is divided into upper parts and lower parts based on a position where a thickness of the side line is half,
wherein the entire lower part of the side line and the upper part of at least the side line are filled on the concave portion, and the rest part of the side line protrudes on the surface of the polymer pattern,
wherein each of the plurality of signal lines includes a first pad unit at the end of the signal line,
wherein each of the plurality of link lines includes a second pad unit at the end of the link line,
wherein each polymer pattern is disposed to be in direct contact with an end of each signal line and an end of each link line,
wherein each polymer pattern is in contact with a side surface of the first substrate continuously from the end of the signal line to the end of the link line,
wherein a width of each of the plurality of polymer patterns is larger than a width of each of the plurality of side lines, and
wherein the plurality of side lines is arranged so as not to directly contact the first substrate.

2. The display device according to claim 1, wherein the plurality of polymer patterns includes an epoxy-based resin.

3. The display device according to claim 1, wherein a width of each polymer pattern is approximately 40 μm to 100 μm, and an interval between the adjacent polymer patterns is approximately 10 μm to 60 μm.

4. The display device according to claim 1, wherein a storage modulus of the plurality of polymer patterns is approximately 100 MPa to 500 MPa.

5. The display device according to claim 1, wherein the concave portion extends from one end of the polymer pattern which is in contact with the end of the each signal line to another end of the polymer pattern which is in contact with the end of the each link line.

6. The display device according to claim 1, wherein each of the plurality of signal lines includes a first pad unit at an end of each signal line and each of the plurality of link lines includes a second pad unit at an end of each link line, and wherein the plurality of side lines is in direct contact with an upper surface of the plurality of signal lines and a lower surface of the plurality of link lines.

7. The display device according to claim 1, wherein the plurality of side lines includes a conductive material and resin.

8. The display device according to claim 1, wherein a width of each side line is approximately 20 μm to 80 μm, and an interval between the adjacent side lines is approximately 20 μm to 100 μm.

9. The display device according to claim 1, further comprising:

a protective layer covering the plurality of side lines and including a black material.

10. The display device according to claim 9, wherein the protective layer is formed as one layer to enclose all side surfaces of the first substrate and cover all of the plurality of side lines or is patterned so as to correspond to each of the plurality of side lines.

11. The display device according to claim 9, wherein each side line is formed to have a tunnel shape to connect the plurality of signal lines and the plurality of link lines between the polymer patterns and the protective layer.

12. The display device according to claim 1, further comprising:

a third substrate disposed below the first substrate, wherein the plurality of link lines is disposed below the third substrate, each polymer pattern is disposed to be in contact with the side surfaces of the first substrate and the third substrate continuously from an end of each signal line to an end of each link line, and each side line is disposed on the polymer pattern to connect each signal line and one link line.

13. The display device according to claim 12, wherein the plurality of link lines is disposed on a lower surface of the third substrate.

14. The display device according to claim 1, wherein the plurality of link lines is disposed on a lower surface of the first substrate.

15. A multi-panel display device, comprising:

a plurality of display devices disposed to be adjacent to each other, a first substrate including a display area and a non-display area which encloses the display area;

a display unit disposed on an upper surface of the first substrate;

a plurality of signal lines disposed on the upper surface of the first substrate and electrically connected to the display unit;

a plurality of link lines disposed below the first substrate;

a plurality of polymer patterns disposed on a side surface of the first substrate, directly contacting each signal line and one link line, and continuously connecting each signal line and one link line to each other;

a plurality of side lines electrically connecting and directly contacting the plurality of signal lines and the plurality of link lines, and disposed on the plurality of polymer patterns to overlap and directly contact each polymer pattern; and a protective layer covering the plurality of side lines, and including a black material, wherein each polymer pattern includes a concave portion which is formed so that at least a part of the surface of each polymer pattern which is in contact with a side line of the plurality of side lines is concavely dented, wherein each of the plurality of side lines is divided into upper parts and lower parts based on a position where a thickness of the side line is half, wherein the entire lower part of the side line and the upper part of at least the side line are filled on the concave portion, and the rest part of the side line protrudes on the surface of the polymer pattern, wherein each of the plurality of signal lines includes a first pad unit at the end of the signal line, wherein each of the plurality of link lines includes a second pad unit at the end of the link line, wherein each polymer pattern is disposed to be in direct contact with an end of each signal line and an end of each link line, wherein each polymer pattern is in contact with a side surface of the first substrate continuously from the end of the signal line to the end of the link line, wherein a width of each of the plurality of polymer patterns is larger than a width of each of the plurality of side lines, and wherein the plurality of side lines is arranged so as not to directly contact with the first substrate.

16. The multi-panel display device according to claim 15, wherein each side line is formed to have a tunnel shape to connect the signal lines and the link lines between the polymer patterns and the protective layer.

17. The multi-panel display device according to claim 15, wherein the plurality of polymer patterns includes an epoxy-based resin, and the plurality of side lines includes a conductive material and a resin.

18. The multi-panel display device according to claim 15, wherein the concave portion extends from one end of the polymer pattern which is in contact with the end of the each signal line to another end of the polymer pattern which is in contact with the end of the each link line.

* * * * *